United States Patent [19]
Richter

[11] Patent Number: 6,103,408
[45] Date of Patent: Aug. 15, 2000

[54] ELECTRIC BATTERY

[75] Inventor: Gerolf Richter, Hildesheim, Germany

[73] Assignee: VB Autobatterie GmbH, Hannover, Germany

[21] Appl. No.: 09/070,447

[22] Filed: Apr. 30, 1998

[30] Foreign Application Priority Data

May 3, 1997 [DE] Germany ............................ 197 18 781

[51] Int. Cl.[7] .......................... H01M 10/48; G01N 27/26
[52] U.S. Cl. .................................. 429/7; 429/90; 320/136; 340/636; 324/426; 324/432; 324/433; 324/436; 324/437
[58] Field of Search ........................................ 429/7, 90–93, 429/62; 320/136; 340/636; 324/425, 426, 432, 433, 436, 437

[56] References Cited

U.S. PATENT DOCUMENTS 3,550,105  12/1970  Decola et al. .
5,238,184  8/1993  Adams ................................ 324/436 X
5,485,744  1/1996  Akutagawa et al. .................. 429/90 X

*Primary Examiner*—Stephen Kalafut
*Assistant Examiner*—Jonathan Crepean
*Attorney, Agent, or Firm*—Schnader Harrison; Segal & Lewis LLP

[57] ABSTRACT

In an electric battery, an electronic clock is integrated in the battery container in order to monitor battery functions. The frequency of the electronic clock is varied as a function of at least one characteristic value of the battery. In one embodiment, the frequency of the electronic clock increases with increasing electrolyte temperature and increasing deviation of the terminal voltage from the open-circuit voltage of the battery. Specifically, the electronic clock may be connected to a measurement probe immersed in the electrolyte through which voltage is supplied to the electronic clock and the battery temperature and the electrolyte level are measured. The electronic clock signals its stopping as soon as a pre-assigned nominal running time is reached.

11 Claims, 1 Drawing Sheet

ELECTRIC BATTERY

BACKGROUND OF THE INVENTION

1. Field of the Invention

The present invention relates to electric batteries having an electronic component integrated in the container for monitoring battery functions.

2. Description of the Related Art

The efforts of battery manufacturers and vehicle suppliers to offer and install starter batteries as permanently sealed, acid-filled, electrically charged energy storage systems has had the consequence that it is very difficult to make a pronouncement concerning the status of such a system. In classical lead batteries provided with cell plugs, the status of the battery could be determined relatively rapidly by simple means on the installed battery for measuring the open-circuit voltage in combination with an acid density check.

In conventional sealed batteries, the degree of wear and therefore the time for a preventive replacement is possible only by a load test with electronic evaluation, in which case a power loss signaling the end of the service life in one of the six cells of an ordinary starter battery is very difficult to recognize.

This lack of information on the anticipated service life of a starter battery is further intensified due to the fact that the maintenance intervals for modern motor vehicles have become increasingly longer and because the battery is very difficult to access at its site of installation.

On the other hand, an increased reliability of the starter battery is required because many electrical components are installed in the vehicle. In particular, the number of power-consuming devices of great importance for the driving fitness of the vehicle is constantly increasing. The requirement for battery reliability is further underscored by the large number of electrically powered safety systems in the vehicle.

In addition, the operating conditions for starter batteries have become worse in part. In particular, in high-charge through-puts in vehicles with a full set of electrical equipment, the constant undercharging in city stop-and-go traffic and the frequent use of automobiles in hot climates must be considered to be service-life limiting, because high temperatures promote corrosion of the lead structural parts in lead batteries, which corrosion is responsible for premature battery failure.

Therefore, when permanently sealed, maintenance-free batteries are used, especially in motor vehicles, the need exists for a constant indication, or in the case of periodic service, for signaling to maintenance personnel using a diagnostic plug, the condition of the battery in terms of the anticipated remaining service life.

In this connection, it is already known that the function of a battery, especially the service life of a battery, can be monitored by integrating a clock chip with a display in the housing lid, which clock chip is connected via connecting wires to the poles of the battery and begins, upon the filling of the acid electrolyte into the battery, an automatic count and indication of the operating time. Such an arrangement, however, can only measure the time expired since the beginning of operational readiness of the battery, while other parameters such as, especially, the temperature curve or variable loads to which the battery is exposed are not allowed for in this way.

SUMMARY OF THE INVENTION

The invention therefore has the objective of devising an electric battery that provides an indication of the service life or the residual life of the battery. According to certain embodiments of the invention, an electronic clock having a variable frequency is integrated into the battery, where the clock frequency is varied as a function of at least one characteristic value of the battery. The possible characteristic battery values used to control the clock frequency include the battery voltage and the electrolyte temperature.

BRIEF DESCRIPTION OF THE DRAWINGS

Other aspects, features, and advantages of the present invention will become more fully apparent from the following detailed description, the appended claims, and the accompanying drawings in which

DETAILED DESCRIPTION

Figure 1:
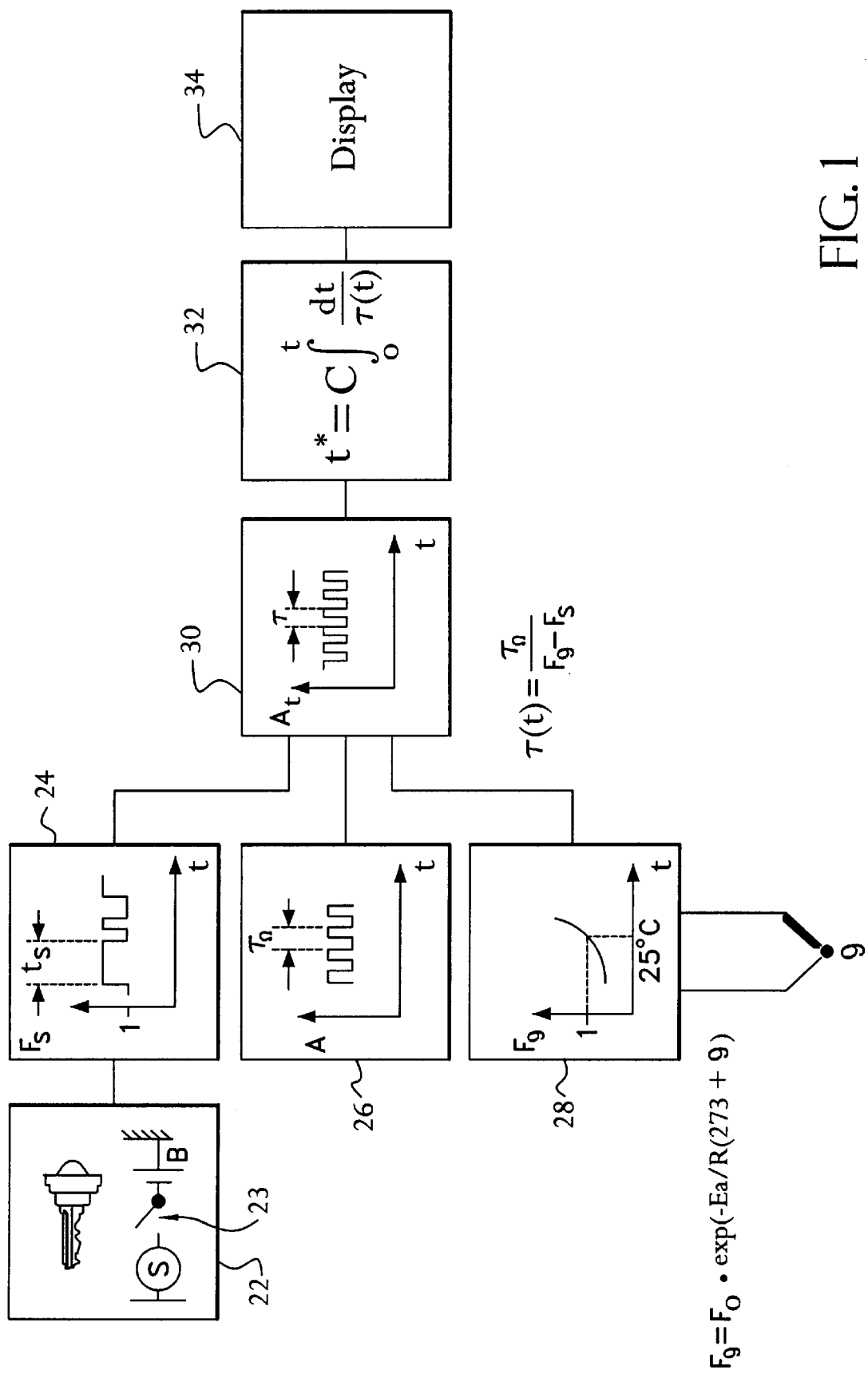
FIG. 1 represents the processing related to adjusting the frequency of the electronic clock in a battery as a function of battery usage and electrolyte temperature, according to one embodiment of the present invention.

According to the present invention, an electronic clock having a variable frequency is integrated into an electric battery, where the clock frequency is varied as a function of at least one characteristic value of the battery. The analog signals supplied by the battery are digitized by a miniaturized computer chip and processed with the aid of specified algorithms. These signals are used to modulate the electronic clock.

Depending on the implementation, the supply of energy to the electronic clock may be provided in a number of different ways. For example, the energy may be supplied by the battery itself through an electrochemical contact with the poles of the battery via connecting conductors soldered into the lid of the container or via a conductor pathway arranged on films. Alternatively, the energy may be supplied via a conductor or conductive pathway to the positive pole and a connection to a rod-shaped sensor made of lead which is immersed in the electrolyte of the negative end cell.

Using the lead sensor rod that closes the circuit of the electronic clock, it is also possible to check when the acid level has fallen below a minimum value as well as to monitor the temperature of the electrolyte by appropriate arrangement of a temperature sensor. At the same time, with this arrangement, the variation of the terminal voltage of the battery with time can be measured.

As to acid level, if the acid level drops below a critical level, the lead sensor rod (e.g., glass carbon) will lose contact with the acid. In that case, the current flow will be interrupted and the function of the clock can be adjusted accordingly. In the immersed state, the contact between a pole and the lead sensor rod supplies a voltage (e.g., 2 volts) multiplied by the number of bridged cells. The current flow is low (typically less than 100 microamperes, but is sufficient to operate the clock.

As to electrolyte temperature, a temperature sensor may be positioned within the same piece (e.g., battery stopper) as the lead sensor rod. The temperature sensor may be a passive resistor or an electric thermocouple with pre-amplifier, and may be located in an immersed hollow plug embedded in a cast material.

In certain embodiments of the invention, at any arbitrary point in time, the electrolyte temperature may be measured in a cell considered to be representative for the battery, and a good approximation of the terminal voltage of the battery can be determined. The drop of the acid level below the minimum value in the representative cell is measured, and the computer chip and digital clock are supplied with current via the sensor rod.

The incoming measured values are processed within pre-assigned time intervals of, e.g., 1–10 minutes. During one measurement time interval, the mean value of the terminal voltage of the battery is formed. The value thus found is compared with the open-circuit voltage of the battery. If the terminal voltage is sufficiently above the open-circuit voltage, then the battery may have been over-charged, e.g., a mass-damaging charge throughput and/or corrosion due to over-voltage has occurred. If the terminal voltage is sufficiently below the open-circuit voltage, then the battery may have been discharged, e.g., a mass-damaging charge throughput was present and/or the battery was stored in a partially discharged state and suffered idle time corrosion.

The degree of deviation of the average voltage from the open-circuit voltage determined in the time interval is weighted in the computer chip, the cases of upward and downward deviation being treated differently, and the frequency of the clock is modulated accordingly.

Likewise, in each measurement time interval, the mean value of the electrolyte temperature is formed and compared with a standard temperature of, e.g., 25° C. If the deviation is sufficiently above the normal temperature, then the elevated electrolyte temperature may promote aging processes such as corrosion and mass sludging. In the case of temperatures lower than normal, these chemical processes may be retarded. Also, the degree of deviation of the temperature average from the normal temperature determined in the time interval is weighted in the computer chip and influences the frequency accordingly.

The frequency-determining part of the digital clock circuit is loaded with the calculated values from the temperature and terminal voltage deviation in such a way that the frequency increases at high electrolyte temperatures and large deviations of the terminal voltage from the open-circuit voltage in both directions and decreases at low electrolyte temperatures. The digital clock circuit in this case is adjusted in such a way that, in the limiting case, i.e., under standard conditions, the clock rate remains constant and the clock follows the service life then to be expected of, e.g., five years. An interruption of the current supply, e.g., when the electrolyte goes below a minimum level and/or when the terminal voltage drops below a value defined as the lower limit, causes the clock to stop. The user or maintenance personnel may derive important information concerning the state of the battery from this and, for example, immediately replace the battery when the clock stops and, if necessary, determine the cause of the failure if the calendar service life is perceived as unusually short. As long as the service-life clock according to certain embodiments of the invention is running, a prediction of the need for battery replacement is possible from the ratio of the reading of the service life clock to the calendar service life.

FIG. 1 represents the processing related to adjusting the frequency of the electronic clock in a battery as a function of battery usage and electrolyte temperature, according to one embodiment of the present invention. Block 22 shows a circuit comprising battery B and starter S, in series with and separated by a key-controlled ignition switch 23. Block 26 shows the output A of the electronic clock over calendar time t with the initial clock frequency ($1/\tau_0$). Block 24 represents the generation of the operating-time weighting function $F_S$ over time t, where $t_S$ represents the different durations in which ignition switch 23 is closed. Block 28 represents the generation of the electrolyte-temperature weighting function $F_\theta$ over time t as a function of the electrolyte temperature $\theta$.

In block 30, the operating-time weighting function $F_S$ and the electrolyte-temperature weighting function $F_\theta$ are used to adjust the initial clock frequency ($1/\tau_0$) to generate the adjusted clock frequency ($1/\tau_1$) according to the following equation:

$$\tau(t) = \frac{\tau_0}{F_\theta \cdot F_s}.$$

Block 32 represents the integration used to generate the overall battery time t*, which will differ from calendar time t depending on the adjustments made to the clock frequency in block 30. Display 34 presents a visible readout of the total battery time for the user to read.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A battery having an electronic clock integrated in the battery container for monitoring battery function, wherein the frequency of the electronic clock varies as a function of at least one characteristic value of the battery and the electronic clock signals its stopping as soon as a pre-assigned nominal running time is reached.

2. The battery of claim 1, wherein the frequency of the electronic clock increases with increasing electrolyte temperature and increasing deviation of the terminal voltage from the open-circuit voltage of the battery.

3. The battery of claim 2, wherein the frequency of the electronic clock decreases with decreasing electrolyte temperature.

4. The battery of claim 2, wherein the electronic clock is coupled with a measuring probe immersed in electrolyte through which voltage is supplied to the electronic clock and the temperature of the battery and its electrolyte level are measured.

5. The battery of claim 2, wherein:

the battery is a multi-cell battery having a positive pole and a negative end cell; and energy is supplied to the electronic clock via a conductor pathway to the positive pole of the multi-cell battery and a rod-shaped lead sensor immersed in electrolyte of the negative end cell.

6. The battery of claim 1, wherein the frequency of the electronic clock increases with increasing electrolyte temperature.

7. The battery of claim 1, wherein the frequency of the electronic clock increases with increasing deviation of the terminal voltage from the open-circuit voltage of the battery.

8. The battery of claim 1, wherein the electronic clock is coupled with a measuring probe immersed in electrolyte through which voltage is supplied to the electronic clock.

9. The battery of claim 8, wherein the temperature of the battery and its electrolyte level are measured by the measuring probe.

10. The battery of claim 9, wherein:

the battery is a multi-cell battery having a positive pole and a negative end cell; and energy is supplied to the electronic clock via a conductor pathway to the positive pole of the multi-cell battery and a rod-shaped lead sensor immersed in electrolyte of the negative end cell.

11. The battery of claim 1, wherein:

the battery is a multi-cell battery having a positive pole and a negative end cell; and energy is supplied to the electronic clock via a conductor pathway to the positive pole of the multi-cell battery and a rod-shaped lead sensor immersed in electrolyte of the negative end cell.

* * * * *